US008592676B2

(12) United States Patent
Ogawa (10) Patent No.: US 8,592,676 B2
(45) Date of Patent: Nov. 26, 2013

(54) SOLAR CELL AND METHOD FOR MANUFACTURING THE SAME

(75) Inventor: Kazufumi Ogawa, Tokushima (JP)

(73) Assignee: Empire Technology Development LLC, Wilmington, DE (US)

(*) Notice: Subject to any disclaimer, the term of this patent is extended or adjusted under 35 U.S.C. 154(b) by 690 days.

(21) Appl. No.: 12/664,242

(22) PCT Filed: Jun. 22, 2007

(86) PCT No.: PCT/JP2007/063053
§ 371 (c)(1),
(2), (4) Date: Dec. 11, 2009

(87) PCT Pub. No.: WO2009/001472
PCT Pub. Date: Dec. 31, 2008

(65) Prior Publication Data
US 2010/0252096 A1 Oct. 7, 2010

(51) Int. Cl.
*H01L 31/00* (2006.01)
*H01L 21/00* (2006.01)

(52) U.S. Cl.
USPC .......... 136/256; 136/252; 136/259; 136/261; 438/57; 438/63; 438/64

(58) Field of Classification Search
USPC ......... 136/244, 250, 251, 252, 256, 259, 261; 438/57, 63, 64
See application file for complete search history.

(56) References Cited

U.S. PATENT DOCUMENTS

| 5,360,745 A * | 11/1994 | Sasaki et al. ............... 438/89 |
| 5,578,141 A * | 11/1996 | Mori et al. ............... 136/251 |
| 2002/0157702 A1* | 10/2002 | Cordaro ............... 136/256 |
| 2006/0051670 A1 | 3/2006 | Aramata et al. |

FOREIGN PATENT DOCUMENTS

| JP | 03-278461 | 12/1991 |
| JP | 07-038126 | 2/1995 |
| JP | 10-247629 | 9/1998 |
| JP | 2002-270923 | 9/2002 |
| JP | 2006-100255 | 4/2006 |
| JP | 2007-173517 | 7/2007 |

OTHER PUBLICATIONS

Green, M.A. and Blakers, A.W., Advantages of Metal-Insulator-Semiconductor Structures for Silicon Solar cells, Solar Cells, Feb. 1983, pp. 3-16, vol. 8, Issue 1.
International Search Report and Written Opinion for PCT/JP2007/063053, mailed Oct. 9, 2007.
Shogo Onishi e tal., "A Novel technique for Preparing a Mono Particle Layer on a Substrate Through the Epoxy-Amino Cross-linking," Proceedings of SPIE, vol. 6415, 2006, pp. 64150W-1 to 6.

* cited by examiner

*Primary Examiner* — Jonathan Johnson
*Assistant Examiner* — Lindsey Bernier
(74) *Attorney, Agent, or Firm* — Foley & Lardner LLP

(57) ABSTRACT

A solar cell in which an n-type fine silicon particle film is formed in a lamination layer on the surface of a transparent substrate via a transparent electrode, and the n-type fine silicon particle film is covalently bound to the transparent electrode via the first organic coating formed on the surface of the transparent electrode and the second organic coating formed on the surface of the n-type fine silicon particle film and the n-type fine silicon particle film is covalently bound to the p-type fine silicon particle film via the second organic coating formed on the surface of the n-type fine silicon particle film and the third organic coating formed on the surface of the p-type fine silicon particle film.

27 Claims, 3 Drawing Sheets

WHERE, ⊖ EXPRESSES THE BONDS OF —(CH$_2$)CHCH$_2$—NHCH$_2$—
$\qquad\qquad\qquad\qquad\qquad\qquad\qquad\qquad\quad\ $ |
$\qquad\qquad\qquad\qquad\qquad\qquad\qquad\qquad\ \ $ OH

FIG.3B

WHERE, ⊖ EXPRESSES THE BONDS OF —(CH$_2$)CHCH$_2$—NHCH$_2$—
$\qquad\qquad\qquad\qquad\qquad\qquad\qquad\qquad\quad\ $ |
$\qquad\qquad\qquad\qquad\qquad\qquad\qquad\qquad\ \ $ OH

SOLAR CELL AND METHOD FOR MANUFACTURING THE SAME

CROSS-REFERENCE TO RELATED APPLICATIONS

The present application is a U.S. national stage application claiming the benefit of International Application No. PCT/JP2007/063053, filed on Jun. 22, 2007, the entire contents of which are incorporated herein by reference in their entirety.

BACKGROUND OF THE INVENTION

1. Field of the Invention

The present invention is related to a solar cell and the method for manufacturing the same. In particular, it relates to a solar cell with a large area and a uniform film thickness of fine silicon particles, and the method for manufacturing the same, in which the fine particles are given either thermal reactivity or light reactivity, or otherwise radical reactivity or ionic reactivity to the surface of the semi-conductive fine silicon particles.

In the present invention, the fine silicon particles shall include semi-conductive n-type fine silicon particles and semi-conductive p-type fine silicon particles.

2. Description of Related Art

Conventional silicon solar cells are known to include silicon amorphous solar cells that are formed into a film on a glass substrate surface using plasma CVD and silicon crystal solar cells in which silicon crystal or polysilicon crystal is cut into plate form and then impurities are diffused. For example, the following patent is acknowledged.

[Patent document 1] Japanese Patent Application Laid Open No. 10-247629

However, conventional silicon amorphous solar cells have the disadvantage of high production cost because of the expensive vacuum equipment. In addition, the silicon crystal solar cells have the disadvantage of high production cost because of the large amount of high purity silicon crystals or polysilicon crystals that are necessary.

The present invention aims to provide a large-area solar cell and a method for manufacturing the same that allows a significant reduction in costs, while using silicon, compared to the use of conventional amorphous solar cells or silicon crystal solar cells.

SUMMARY OF THE INVENTION

Accordingly, it would be advantageous to provide a solar cell in which a transparent electrode covered by a first organic coating, an n-type fine silicon particle film covered by a second organic coating, and a p-type fine silicon particle film covered by a third organic coating form a lamination layer on the surface of a transparent substrate one after another, and the first organic coating and the second organic coating, and also the second organic coating and the third organic coating are respectively covalently bound to each other.

The second aspect of this invention is the solar cell of the first aspect of this invention in which the first organic coating formed on the surface of the transparent substrate and the second organic coating formed on the surface of the n-type fine silicon particle, and the second organic coating formed on the surface of the n-type fine silicon particle and the third organic coating formed on the surface of the p-type fine silicon particle film are different from each other.

The third aspect of this invention is the solar cell of the first aspect of this invention in which the covalent bond is an N—C bond formed by a reaction between an epoxy group and an imino group.

The fourth aspect of this invention is the solar cells of the first or the second aspects of this invention in which the first, second, and third organic coatings comprise a monomolecular film.

The fifth aspect of this invention is a method for manufacturing a solar cell comprising: a process of forming a first reactive organic coating on the surface of a transparent electrode by contacting the surface of the transparent electrode to an alkoxysilane compound among a chemical absorption liquid produced from a mixture of at least a first alkoxysilane compound, a silanol condensation catalyst, and a nonaqueous organic solvent in order for the surface of the transparent electrode to react with the alkoxysilane compound; a process of forming a second reactive organic coating on the surface of the fine silicon particles by dispersing the n-type fine silicon particles among a chemical absorption liquid produced from a mixture of at least a second alkoxysilane compound, a silanol condensation catalyst, and a nonaqueous organic solvent in order for the surface of the n-type fine silicon particles to react with the alkoxysilane compound; a process of forming a third reactive organic coating on the surface of the fine silicon particles by dispersing the p-type fine silicon particles among a chemical absorption liquid produced from a mixture of at least a third alkoxysilane compound, a silanol condensation catalyst, and a nonaqueous organic solvent in order for the surface of the p-type fine silicon particles to react with the alkoxysilane compound; a process of having the transparent electrode on the surface of the transparent substrate, on which the first reactive organic coating is formed, contact the n-type fine silicon particles coated by the second reactive organic coating for reaction; a process of forming a monostratal n-type fine silicon particle film by cleaning and removing redundant n-type fine silicon particles coated by the second reactive organic coating; a process of having the film surface of the n-type fine silicon particles, on which the second reactive organic coating is formed, contact the p-type fine silicon particles coated by the third reactive organic coating for reaction; a process of forming a monostratal p-type fine silicon particle film by cleaning and removing redundant p-type fine silicon particles coated by the third reactive organic coating; and a process of forming a back surface electrode.

The sixth aspect of this invention is the method for manufacturing a solar cell in the fifth aspect of this invention in which the first, second, and third reactive monomolecular films, which are covalently bound to the surface of the transparent electrode, n-type fine silicon particles, and p-type fine silicon particles are formed by cleaning with an organic solvent after the respective reactions with the alkoxysilane compounds in the process of forming the first reactive organic coating, the process of forming the second reactive organic coating, and the process of forming the third reactive organic coating.

The seventh aspect of this invention is the method for manufacturing a solar cell in the fifth aspect of this invention in which either the first and third reactive organic coatings contain an epoxy group and the second reactive organic coating contains an imino group, or the first and third reactive organic coatings contain an imino group and the second reactive organic coating contains an epoxy group.

The eighth aspect of this invention is the method for manufacturing a solar cell in the sixth aspect of this invention in which either the first and third reactive monomolecular films contain an epoxy group and the second reactive monomolecular film contains an imino group, or the first and third reactive monomolecular films contain an imino group and the second reactive monomolecular film contains an epoxy group.

The ninth aspect of this invention is the solar cell of the first aspect of this invention in which two or more layers of n-type fine silicon particle films and p-type fine silicon particle films are respectively formed into a stacked film via an organic coating.

The tenth aspect of this invention is the solar cell of the ninth aspect of this invention in which the organic coatings formed on the surfaces of the n-type and p-type fine silicon particles, respectively, have two types, and the fine silicon particles with the second organic coating formation and the fine silicon particles with the third organic coating formation are alternately stacked.

The eleventh aspect of this invention is the solar cell of the tenth aspect of this invention in which the second organic coating and the third organic coating react with each other to form a covalent bond.

The twelfth aspect of this invention is the solar cell of the eleventh aspect of this invention in which the covalent bond is an N—C bond formed by a reaction between an epoxy group and an imino group.

The thirteenth aspect of this invention is the method for manufacturing a solar cell in the fifth aspect of this invention comprising: a process of forming a monostratal n-type fine silicon particle film, followed by a process of having the film surface of the n-type fine silicon particles, on which the second reactive organic coating is formed, contact the n-type fine silicon particles coated by the fourth reactive organic coating for reaction, and a process of forming the second layer of the n-type fine silicon particle film by cleaning and removing redundant n-type fine silicon particles coated by the fourth reactive organic coating; as well as a process of forming a monostratal p-type fine silicon particle film, followed by a process of having the film surface of the p-type fine silicon particles, on which the third reactive organic coating is formed, contact the p-type fine silicon particles coated by the fifth reactive organic coating for reaction, and a process of forming the second layer of the p-type fine silicon particle film by cleaning and removing redundant p-type fine silicon particles coated by the fifth reactive organic coating.

The fourteenth aspect of this invention is the method for manufacturing a solar cell in the thirteenth aspect of this invention in which the organic coatings contacting each other between layers are combined with functional groups that mutually react with each other.

The fifteenth aspect of this invention is the method for manufacturing a solar cell in the thirteenth aspect of this invention in which the silicon file particle film is formed by accumulating an arbitrary number of layers as n-type and p-type fine silicon particle films.

The sixteenth aspect of this invention is the method for manufacturing a solar cell in the thirteenth aspect of this invention in which after the process of forming the first to fifth reactive organic coatings, the transparent electrode, or the surface of the fine silicon particles are cleaned with an organic solvent to form the first to fifth reactive monomolecular films, which are covalently bound with the transparent electrode or the surface of the fine silicon particles, respectively.

The seventeenth aspect of this invention is the method for manufacturing a solar cell in the fourteenth aspect of this invention in which the combination of the functional groups reacting with each other is that of an epoxy group and an imino group.

The eighteenth aspect of this invention is the method for manufacturing a monostratal fine silicon particle film solar cell in the fifth aspect of this invention in which a ketimine compound, organic acid, aldimine compound, enamine compound, oxazolidine compound, or an aminoalkylalkoxysilane compound is used instead of the silanol condensation catalyst.

The nineteenth aspect of this invention is the method for manufacturing a monostratal fine silicon particle film solar cell in the fifth aspect of this invention in which at least one promoter, chosen from a ketimine compound, organic acid, aldimine compound, enamine compound, oxazolidine compound, or an aminoalkylalkoxysilane compound, is mixed with the silanol condensation catalyst for use.

The gist of the above present invention is further explained hereinafter.

The gist of the present invention is to provide a solar cell in which a transparent electrode covered by a first organic coating, an n-type fine silicon particle film covered by a second organic coating, and a p-type fine silicon particle film covered by a third organic coating form a lamination layer on the surface of a transparent substrate one after another, and the first organic coating and the second organic coating, and also the second organic coating and the third organic coating are respectively covalently bound to each other through a process of forming the first reactive organic coating on the surface of the transparent electrode by contacting the surface of the transparent electrode with an alkoxysilane compound among a chemical absorption liquid produced from a mixture of at least the first alkoxysilane compound, a silanol condensation catalyst, and a nonaqueous organic solvent in order for the surface of the transparent electrode to react with the alkoxysilane compound; a process of forming a second reactive organic coating on the surface of the fine silicon particles by dispersing the n-type fine silicon particles among a chemical absorption liquid produced from a mixture of at least the second alkoxysilane compound, a silanol condensation catalyst, and a nonaqueous organic solvent in order for the surface of the n-type fine silicon particles to react with the alkoxysilane compound; a process of forming a third reactive organic coating on the surface of the fine silicon particles by dispersing the p-type fine silicon particles among a chemical absorption liquid produced from a mixture of at least the third alkoxysilane compound, a silanol condensation catalyst, and a nonaqueous organic solvent in order for the surface of the p-type fine silicon particles to react with the alkoxysilane compound; a process of having the transparent electrode on the surface of the transparent substrate, on which the first reactive organic coating is formed, contact the n-type fine silicon particles coated by the second reactive organic coating for reaction; a process of forming a monostratal n-type fine silicon particle film by cleaning and removing redundant n-type fine silicon particles coated by the second reactive organic coating; a process of having the film surface of the n-type fine silicon particles, on which the second reactive organic coating is formed, contact the p-type fine silicon particles coated by the third reactive organic coating for reaction; a process of forming a monostratal p-type fine silicon particle film by cleaning and removing redundant p-type fine silicon particles coated by the third reactive organic coating; and a process of forming a back surface electrode.

If the first organic coating formed on the surface of the transparent substrate and the second organic coating formed on the surface of the n-type fine silicon particle, and the second organic coating formed on the surface of the n-type fine silicon particle and the third organic coating formed on the surface of the p-type fine silicon particle film are different from each other, it is advantageous for stacking the fine silicon particle films.

In addition, if the covalent bond is an N—C bond formed by a reaction between an epoxy group and imino group, it is advantageous for increasing the binding force between films.

Furthermore, if the first, second, and third organic coatings are composed of monomolecular films, it is advantageous for reducing the internal resistance of the cell.

In addition, if the first, second, and third reactive monomolecular films, which are covalently bound to the surface of the transparent electrode, n-type fine silicon particles, and p-type fine silicon particles, are formed by cleaning with an organic solvent after the respective reactions with the alkoxysilane compounds in the process of forming the first reactive organic coating, the process of forming the second reactive organic coating, and the process of forming the third reactive organic coating, it is advantageous for reducing the internal resistance of the cell.

In addition, if the first and third reactive monomolecular films (or organic coatings) contain an epoxy group and the second reactive organic coating contains an imino group, or if the first and third reactive organic coatings contain an imino group and the second reactive monomolecular film (or organic coating) contains an epoxy group, it is advantageous for simplifying the manufacturing process.

Furthermore, the gist of the present invention is to manufacture and provide a solar cell in which each of the semi-conductive layers of the n-type and p-type fine silicon particle films comprises two or more layers of fine particle films.

If two types of organic coatings that are formed on each surface of the n-type and p-type fine silicon particles are prepared and the fine silicon particles with the second organic coating formation and the fine silicon particles with the third organic coating formation are alternately stacked, it is advantageous for accumulating two or more layers of fine silicon particle films.

If the first organic coating and the second organic coating react to form a covalent bond, it is advantageous for increasing the strength of the resistance to exfoliation.

In addition, if the covalent bond is an N—C bond formed by a reaction between an epoxy group and imino group, it is advantageous for stabilizing the accumulation process.

It is advantageous for stabilizing the accumulation process, if performing a process of forming a monostratal n-type fine silicon particle film, followed by a process of having the film surface of the n-type fine silicon particles, on which the second reactive organic coating is formed, contact the n-type fine silicon particles coated by the fourth reactive organic coating for reaction, and a process of forming the second layer of the n-type fine silicon particle film by cleaning and removing redundant n-type fine silicon particles coated by the fourth reactive organic coating; as well as a process of forming a monostratal n-type fine silicon particle film, followed by a process of having the film surface of the p-type fine silicon particles, on which the third reactive organic coating is formed, contact the p-type fine silicon particles coated by the fifth reactive organic coating for reaction, and a process of forming the second layer of the p-type fine silicon particle film by cleaning and removing redundant p-type fine silicon particles coated by the fifth reactive organic coating.

In so doing, if the organic coatings contacting each other between layers are used by combining with functional groups that mutually react with each other, it is advantageous for stabilizing the accumulation process. Furthermore, if the silicon file particle film is formed by accumulating an arbitrary number of layers as n-type and p-type fine silicon particle films, it is advantageous for improving the light absorption efficiency.

In addition, after the process of forming the first to fifth reactive organic coatings, if the transparent electrode or the surface of the fine silicon particles are cleaned with an organic solvent to form the first to fifth reactive monomolecular films, which are covalently bound with the transparent electrode or the surface of the fine silicon particles, respectively, it is advantageous for reducing the internal resistance of the cell.

Moreover, if the combination of the functional groups reacting with each other is that of an epoxy group and an imino group, it is advantageous for simplifying the accumulation process. In addition, if a ketimine compound, organic acid, aldimine compound, enamine compound, oxazolidine compound, or an aminoalkylalkoxysilane compound is used instead of the silanol condensation catalyst, or if at least one promoter, chosen from a ketimine compound, organic acid, aldimine compound, enamine compound, oxazolidine compound, or an aminoalkylalkoxysilane compound, is mixed with the silanol condensation catalyst, it advantageously allows a reduction in the manufacturing time.

As described above, the present invention has the particular effect of providing a fine silicon particle film solar cell in which each n-type and p-type fine silicon particles are formed into a single-layered film with an even thickness at the particle size level on the surface of any transparent substrate or providing a fine silicon particle film stacked solar cell, in which two or more layers of films each made by aligning a single layer of n-type fine silicon particles and a single layer of p-type fine silicon particles are accumulated, and providing the methods for manufacturing these at a low cost without losing the original function of the fine silicon particles while using semi-conductive fine silicon particles.

BRIEF DESCRIPTION OF THE DRAWINGS

FIG. 1 is a conceptual diagram of the first example of the present invention that expands the reaction of the surface of the fine silicon particle to the molecular level.

FIG. 2 is a conceptual diagram of the second example of the present invention, which expands the reaction of the surface of the glass substrate to the molecular level.

FIG. 3 is a conceptual diagram of the third example of the present invention, which expands the reaction of the surface of the glass substrate to the molecular level.

DETAILED DESCRIPTION

The present invention provides a solar cell in which a transparent electrode covered by a first organic coating, an n-type fine silicon particle film covered by a second organic coating, and a p-type fine silicon particle film covered by a third organic coating form a lamination layer on the surface of a transparent substrate one after another, and the first organic coating and the second organic coating, and also the second organic coating and the third organic coating are respectively covalently bound to each other through a process of forming the first reactive organic coating on the surface of the transparent electrode by contacting the surface of the transparent electrode with an alkoxysilane compound among a chemical absorption liquid produced from a mixture of at least the first alkoxysilane compound, a silanol condensation catalyst, and a nonaqueous organic solvent in order for the surface of the transparent electrode to react with the alkoxysilane compound; a process of forming a second reactive organic coating on the surface of the fine silicon particles by dispersing the n-type fine silicon particles among a chemical absorption liquid produced from a mixture of at least the second alkoxysilane compound, a silanol condensation catalyst, and a nonaqueous organic solvent in order for the surface of the n-type fine silicon particles to react with the alkoxysilane compound; a process of forming a third reactive organic coating on the surface of the fine silicon particles by dispersing the p-type fine silicon particles among a chemical absorption liquid produced from a mixture of at least the third alkoxysilane compound, a silanol condensation catalyst, and a nonaqueous organic solvent in order for the surface of the p-type fine silicon particles to react with the alkoxysilane compound; a process of having the transparent electrode on the surface of the transparent substrate, on which the first reactive organic coating is formed, contact the n-type fine silicon particles coated by the second reactive organic coating for reaction; a process of forming a monostratal n-type fine silicon particle film by cleaning and removing redundant n-type fine silicon particles coated by the second reactive organic coating; a process of having the film surface of the n-type fine silicon particles, on which the second reactive organic coating is formed, contact the p-type fine silicon particles coated by the third reactive organic coating for reaction; a process of forming a monostratal p-type fine silicon particle film by cleaning and removing redundant p-type fine silicon particles coated by the third reactive organic coating; and a process of forming a back surface electrode.

Therefore, the present invention provides a fine silicon particle film solar cell in which each n-type and p-type fine silicon particles are formed into a single-layered film with an even thickness at the particle size level on the surface of any transparent substrate or provides a large-area fine silicon particle film stacked solar cell, in which two or more layers of films each made by aligning a single layer of n-type fine silicon particles and a single layer of p-type fine silicon particles are accumulated, and provides the methods for manufacturing these without losing the original function of the fine silicon particles while using semi-conductive fine silicon particles.

Hereinafter, although representative examples are shown to describe the details of the present invention based on the case of using fine silicon particles, these examples shall not be construed as limiting the present invention.

Example 1

First, an anhydrous n-type fine silicon particle 1 with a size ranging from 100 to 5 nm was prepared and dried thoroughly. Next, as a chemical absorption agent, an agent containing a reactive functional group (e.g. epoxy group or imino group) at the functional site and an alkoxysilane compound at the other end, for example the agent shown in the following chemical formula (Formula 1) or (Formula 2), was measured at 99 w/t % and as a silanol condensation catalyst, for example, dibutyltin diacetylacetonate or acetic acid (a type of organic acid)

was measured at 1 w/t %, respectively. These were dissolved into a silicone solvent (e.g. a mixed solvent with 50% of hexamethyldisiloxane and 50% of dimethylformamide) to prepare a chemical absorption liquid for a concentration of about 1 w/t % (preferably the concentration of the chemical absorption agent is about 0.5% to 3%).

[Formula 1]

[Formula 2]

Figure 1A:
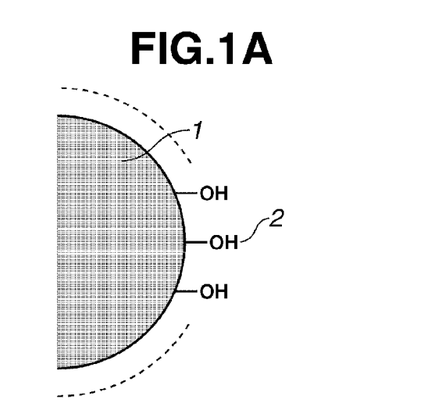
FIG. 1A shows the surface of the n-type fine silicon particle before the reaction.

The foregoing anhydrous n-type fine silicon particles 1 were mixed and stirred in this absorption liquid and reacted in a normal atmosphere (55% relative humidity) for about two hours. In this case, since the surface of the anhydrous n-type fine silicon particle is bound with many hydroxyl groups 2 at the dangling bonds (shown in FIG. 1A), a chemical absorption monomolecular film 3 containing epoxy groups or a chemical absorption film 4 containing amino groups, which forms a chemical bond with the surface of the fine silicon particles throughout the surface, was formed at a thickness of about 1 nm because of the bonding formation shown in the following chemical formula (Formula 3) or (Formula 4) by a dealcoholization reaction (in this case, de-$CH_3OH$) between $Si(OCH_3)$ group of the foregoing chemical absorption agent and the foregoing hydroxyl groups under the presence of the silanol condensation catalyst or acetic acid, a type of organic acid (shown in FIGS. 1B and 1C). When using an absorption agent containing an amino group, it was better to use an organic acid, such as acetic acid, since the tintype catalyst produced a deposition. Although the amino group contains an imino group, substances such as pyrrole derivative and imidazole derivatives other than the amino group also contain the imino group. Furthermore, when a ketimine derivative was used, the amino group was easily introduced by hydrolysis after the coating formed.

Figure 1B:
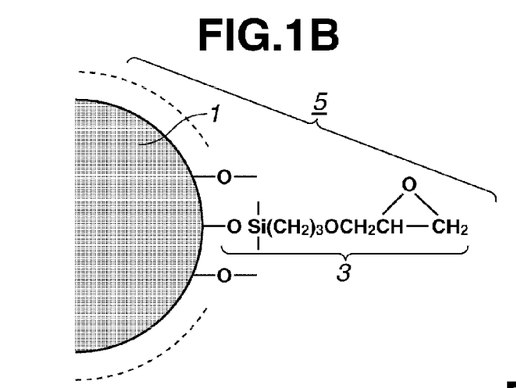
FIG. 1B shows the surface after a monomolecular film containing an epoxy group is formed.
Figure 1C:
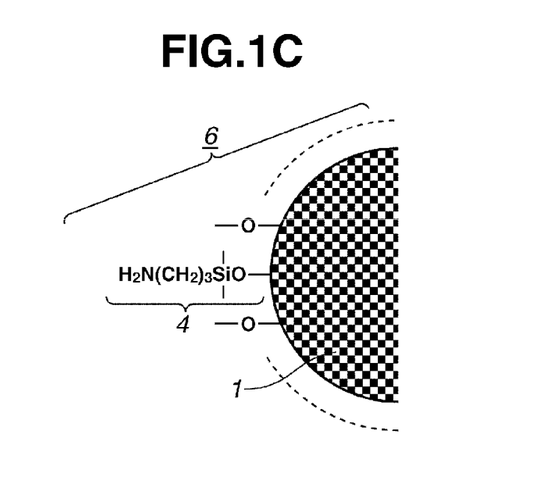
FIG. 1C shows the surface after a monomolecular film containing an amino group is formed.

Then a chlorinated solvent, such as tricren, was added to the mixture and stirred for cleaning, and thus an n-type fine silicon particle 5, which was covered by the chemical absorption monomolecular film containing a reactive functional group (e.g. epoxy group) over the surface or an n-type fine silicon particle 6, which was covered by the chemical absorption monomolecular film containing an amino group, could be manufactured respectively.

[Formula 3]

[Formula 4]

Since this coating is extremely thin with a film thickness at the nanometer level, the particle diameter was not impaired.

In addition, since the processed part had an extremely thin coating with a film thickness of the nanometer level, the particle diameter was not impaired. Furthermore, since this coating had a withstand voltage of 0.1 V or less, it had almost no electrical insulating characteristics while maintaining the ability to prevent the oxidization process of silicon.

On the other hand, when it was removed from the atmosphere without cleaning, the reactivity was almost the same; however, the solvent evaporated and the chemical absorption agent left behind on the surface of the particle reacted at the surface with the moisture in the atmosphere, then an n-type fine silicon particle was obtained on which an extremely thin polymer coating (still thicker than a monomolecular film) was formed from the foregoing chemical absorption agent at the surface.

Example 2

Figure 2A:
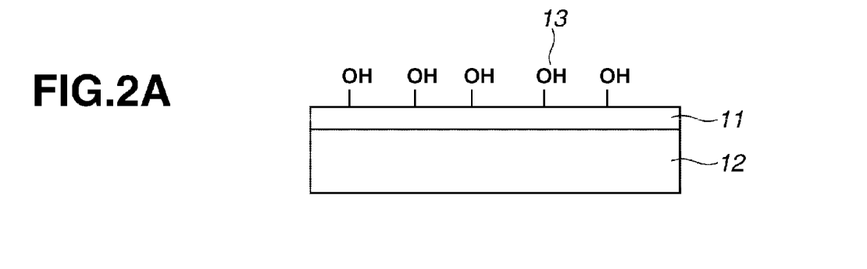
FIG. 2A shows the surface of the ITO electrode before the reaction.
Figure 2B:
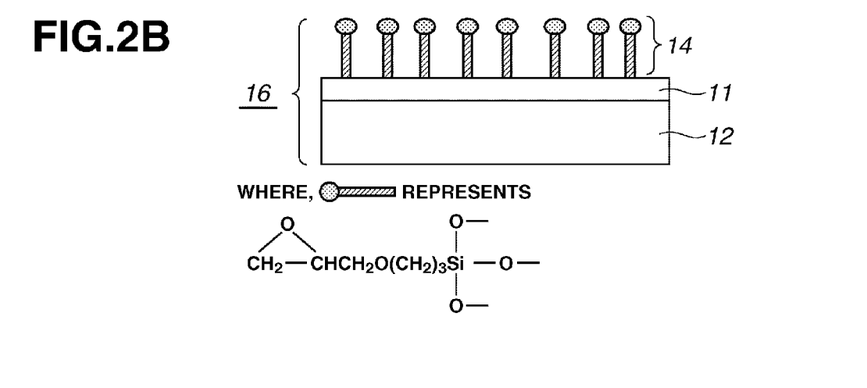
FIG. 2B shows the surface after a monomolecular film containing an epoxy group is formed.
Figure 2C:
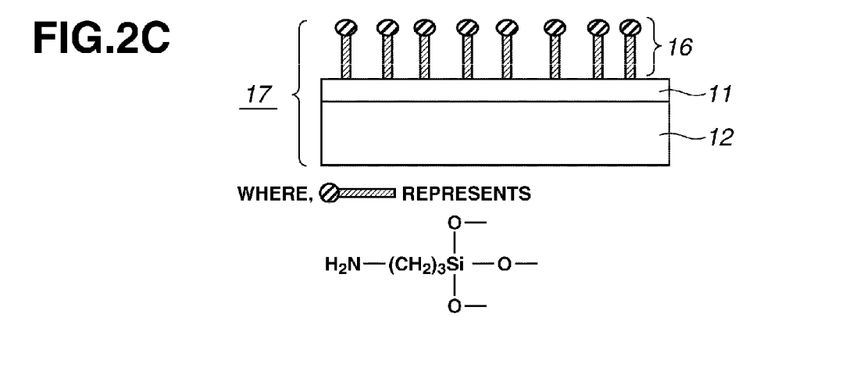
FIG. 2C shows the surface after a monomolecular film containing an amino group is formed.

Similar to Example 1, first, a glass substrate 12 on which an ITO transparent electrode 11 was formed, was prepared and dried very well. Next, as a chemical absorption agent, an agent containing a reactive functional group (e.g. epoxy group or imino group) at the functional site and an alkoxysilane compound at the other end, for example the agent shown in the foregoing chemical formula [Formula 1] (or [Formula 2]), was measured at 99 w/t %, and as a silanol condensation catalyst, for example, dibutyltin diacetylacetonate was measured at 1 w/t %, respectively, and these were dissolved into a silicon solvent (e.g. hexamethyldisiloxane solvent) to prepare a chemical absorption liquid so that it had a concentration of about 1 w/t % (preferably the concentration of the chemical absorption agent is about 0.5 to 3%).

Then the glass substrate 2 was immersed in this absorption liquid and reacted in a normal atmosphere (45% relative humidity) for about two hours. In this case, since the surface of the ITO transparent electrode 11 contains many hydroxyl groups 13 (shown in FIG. 2A), a chemical absorption monomolecular film 14 containing epoxy groups (FIG. 2B) (or a chemical absorption film 15 containing amino groups (FIG. 2C)), which forms a chemical bond with the surface of the ITO transparent electrode throughout the surface, was formed at a thickness of about 1 nm because of the bonding formation shown in the foregoing chemical formula [Formula 3] (or the chemical formula [Formula 4]) by a dealcoholization reaction (in this case, de-$CH_3OH$) between $Si(OCH_3)$ group of the foregoing chemical absorption agent and the foregoing hydroxyl groups under the presence of the silanol condensation catalyst.

Then a chlorinated solvent, such as tricren, was used for cleaning, and thus a glass substrate 16, on which ITO transparent electrode 11 was covered by the chemical absorption monomolecular film containing a reactive functional group (e.g. epoxy group) over the surface or a glass substrate 17, which was covered by the chemical absorption monomolecular film containing an amino group, was able to be manufactured, respectively. (Shown in FIG. 2B and FIG. 2C)

Since this coating is extremely thin with a film thickness at the nanometer level, the conductivity of ITO transparent electrode 11 and the transparency of glass substrate 12 were not impaired.

On the other hand, when it was taken out into the atmosphere without cleaning, the insulation, transparency, and reactivity were almost the same; however, the solvent evaporated and the chemical absorption agent left behind on the surface of the transparent electrode reacted at the surface with the moisture in the atmosphere, then a glass substrate, on which an extremely thin polymer coating was formed from the foregoing chemical absorption agent on the surface, was obtained.

Example 3

Figure 3A:
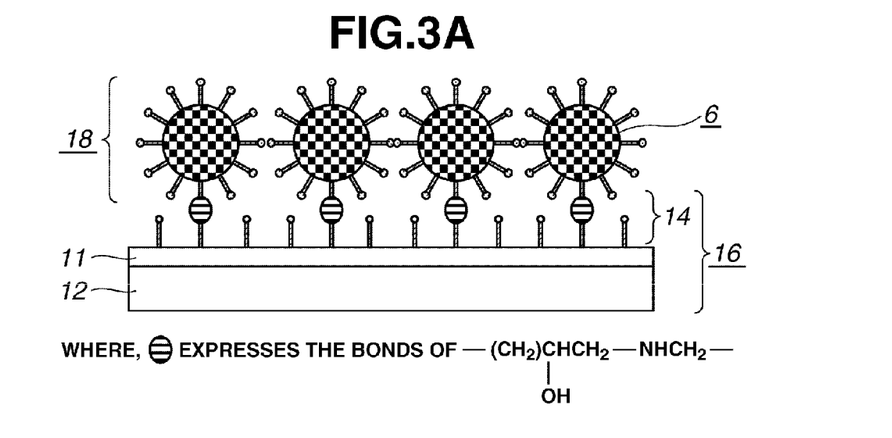
FIG. 3A shows the surface of the transparent substrate where a monostratal n-type fine silicon particle film is formed on the surface of the ITO electrode.

Next, when n-type fine silicon particles 6, which were covered by a chemical absorption monomolecular film containing the amino group, were dispersed in alcohol to apply to the surface of ITO transparent electrode 11 covered by a chemical absorption monomolecular film containing the foregoing epoxy group (it can be a combination of the surface of the ITO transparent electrode covered by a chemical absorption monomolecular film containing the foregoing amino group and n-type fine silicon particles covered by a chemical absorption monomolecular film containing an epoxy group) and were heated at 100 degrees Celsius; the amino group on the surface of the n-type fine silicon particles contacting the epoxy group on the surface of the ITO transparent electrode was added by a reaction as shown in the following formula [Formula 5] so that the fine silicon particles and the surface of the ITO transparent electrode were bound to each other and solidified via the two monomolecular films. When the alcohol evaporated while applying ultrasound, the evenness of the film thickness of the coating improved.

[Formula 5]

Then, the surface of the transparent substrate was cleaned with alcohol, and the redundant n-type fine silicon particles covered by the chemical absorption monomolecular film containing an unreacted amino group were cleaned and removed, thus a monostratal n-type fine silicon particle film 18 was formed with an even thickness at the particle size level by arranging only a single layer of the n-type fine silicon particles covered by the chemical absorption monomolecular film containing the amino group that was covalently bound via the epoxy group of the ITO transparent electrode 11 on the surface of the glass substrate 16. (Shown in FIG. 3A) Since the thickness of the monostratal fine silicon particle film made by the n-type fine silicon particles is 100 nm or less with extremely good evenness, no interference color was observed.

On the other hand, when a coating of n-type fine silicon particles covered by a chemical absorption monomolecular film containing an epoxy group was formed on the surface of the ITO transparent electrode covered by a chemical absorption monomolecular film containing an amino group, a monostratal fine silicon particle film was formed with even thickness at the particle size level by arranging only a single layer of the n-type fine silicon particles covered by the chemical absorption monomolecular film containing an epoxy group that was covalently bound to the surface of the ITO transparent electrode.

Next, when p-type fine silicon particles 19, which were covered by a chemical absorption monomolecular film containing an amino group, were produced the same as Example 1 and were dispersed in alcohol to apply to the surface of the n-type fine silicon particle film covered by the chemical absorption monomolecular film, containing the foregoing amino group, and were heated at 100 degrees Celsius; the epoxy group on the surface of the p-type fine silicon particles contacting the monostratal n-type fine silicon particle film 18 covered by the chemical absorption monomolecular film containing the amino group was added in a similar way as above so that the n-type fine silicon particles and the p-type fine silicon particles were bound to each other and solidified via the two monomolecular films. Then, the surface of the transparent substrate was cleaned with alcohol, and the redundant p-type fine silicon particles covered by the chemical absorption monomolecular film containing unreacted epoxy group were cleaned and removed, thus a monostratal p-type fine silicon particle film 20 was formed with even thickness at the particle size level by arranging only a single layer of the p-type fine silicon particles covered by the chemical absorption monomolecular film containing an epoxy group on the surface of the n-type fine silicon particles 18 covered by the chemical absorption monomolecular film containing an amino group that was covalently bound via the epoxy group of the ITO transparent electrode 11 on the surface of the glass substrate 16. (Shown in FIG. 3B)

Figure 3B:
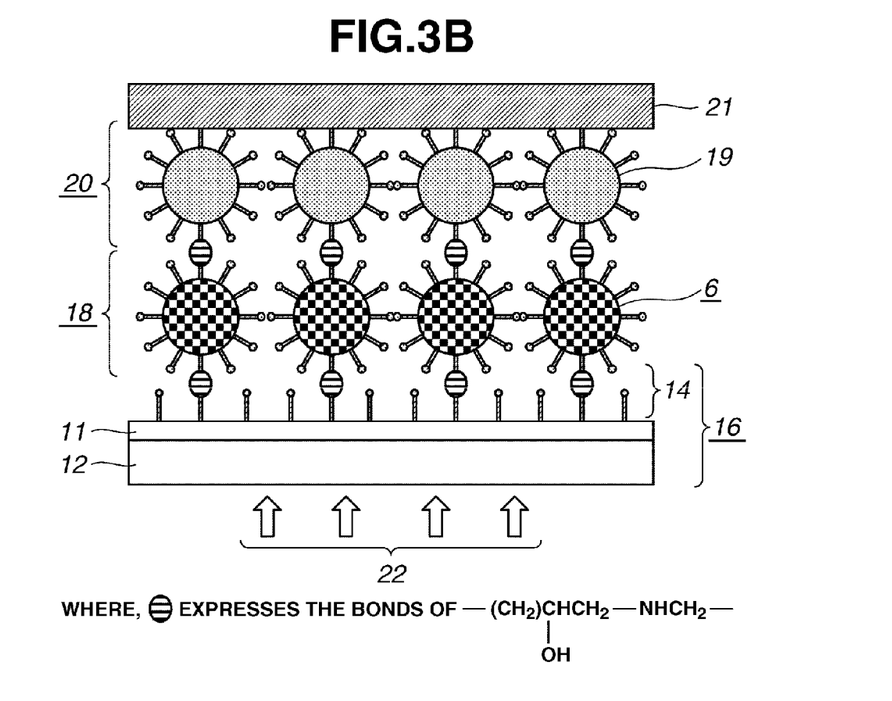
FIG. 3B is a conceptual section view of the solar cell where one layer of a monostratal p-type fine silicon particle film is further formed on the surface of the monostratal n-type fine silicon particle film.

Finally, an Al film 21 was formed as a back surface electrode by evaporation to create a solar cell that receives light 22, which is irradiated from the side of the glass substrate.

Example 4

In addition, when the thickness of the semi-conductive layer needs to be thickened, following Example 3, after formation of the monostratal n-type fine silicon particle film or the monostratal p-type fine silicon particle film, the film thickness was easily controlled if two or more layers of monostratal n-type fine silicon particle films or monostratal p-type fine silicon particle films were formed in such a way that the epoxy group or amino group were alternately sacked to join with each other, respectively.

For example, the n-type fine silicon particles 5, which were covered by a chemical absorption monomolecular film containing an epoxy group, were dispersed in alcohol to apply to the ITO transparent substrate 11, on which the monostratal fine silicon particle film 17 was formed with even thickness at the particle size level, while the n-type fine silicon particles that were covered by the chemical absorption monomolecular film containing the covalently bound amino group were arranged only in a single layer and were heated at 100 degrees Celsius; the epoxy group on the surface of the n-type fine silicon particles contacting the amino group on the surface of the glass substrate, on which the monostratal fine silicon particle film of the n-type fine silicon particles covered by the chemical absorption monomolecular film containing the amino group, were added by a reaction as shown in the foregoing formula (Formula 5) to bind and solidify the fine silicon particles covered by the chemical absorption monomolecular film containing the amino group and the n-type fine silicon particles covered by the chemical absorption monomolecular film containing the epoxy group on the surface of the ITO transparent electrode 11 via the two monomolecular films.

Then, the surface of the transparent substrate was cleaned with alcohol, and n-type fine silicon particles covered by the chemical absorption monomolecular film containing redundant unreacted epoxy group were cleaned and removed, thus a monostratal n-type fine silicon particle film with a double-layered structure was formed with even thickness at the particle size level, while the second layer of the n-type fine silicon particles covalently bound to the surface of the ITO transparent electrode 11 was arranged only in a single layer.

Likewise, when the p-type fine silicon particles covered by a chemical absorption monomolecular film containing an amino group, and the p-type fine silicon particles covered by a chemical absorption monomolecular film containing an epoxy group were alternately stacked, a solar cell with any thickness composed of fine silicon particle films in which the semi-conductive part has an accumulated structure could be produced.

Here, the reactive monomolecular films on the surface of the p-type and n-type fine silicon particles serve to form an accumulated film of fine silicon particles and to protect against the oxidation of p-type and n-type fine silicon particles in the atmosphere. Since this reactive monomolecular film has a thickness of about 1 nm, it did not interfere with the conductivity of the silicon.

In addition, by controlling the particle diameter of the fine silicon particle between 100 nm to 1 nm, the range of the absorption wavelength was controlled from the infrared light region to the visible light region.

Although the above Examples 1 and 2 used the substance shown in [Formula 1] or [Formula 2] as a chemical absorption agent containing a reactive group, the following substances (1) to (16) other than those described above could also be used.

(1) $(CH_2OCH)CH_2O(CH_2)_7Si(OCH_3)_3$
(2) $(CH_2OCH)CH_2O(CH_2)_{11}Si(OCH_3)_3$
(3) $(CH_2CHOCH(CH_2)_2)CH(CH_2)_2Si(OCH_3)_3$
(4) $(CH_2CHOCH(CH_2)_2)CH(CH_2)_4Si(OCH_3)_3$
(5) $(CH_2CHOCH(CH_2)_2)CH(CH_2)_6Si(OCH_3)_3$
(6) $(CH_2OCH)CH_2O(CH_2)_7Si(OC_2H_5)_3$
(7) $(CH_2OCH)CH_2O(CH_2)_{11}Si(OC_2H_5)_3$
(8) $(CH_2CHOCH(CH_2)_2)CH(CH_2)_2Si(OC_2H_5)_3$
(9) $(CH_2CHOCH(CH_2)_2)CH(CH_2)_4Si(OC_2H_5)_3$
(10) $(CH_2CHOCH(CH_2)_2)CH(CH_2)_6Si(OC_2H_5)_3$
(11) $H_2N(CH_2)_5Si(OCH_3)_3$
(12) $H_2N(CH_2)_7Si(OCH_3)_3$
(13) $H_2N(CH_2)_9Si(OCH_3)_3$
(14) $H_2N(CH_2)_5Si(OC_2H_5)_3$
(15) $H_2N(CH_2)_7Si(OC_2H_5)_3$
(16) $H_2N(CH_2)_9Si(OC_2H_5)_3$

Hereinabove, the $(CH_2OCH)$ group represents a functional group shown in the following formula [Formula 6] and the $(CH_2CHOCH(CH_2)_2)CH$ group represents a functional group shown in the following formula [Formula 7].

[Formula 6]

[Formula 7]

In Examples 1 and 2, for the silanol condensation catalyst, groups of carboxylic acid metal salt, carboxylic acid ester metal salt, carboxylic acid metal salt polymer, carboxylic acid metal salt chelate, titanic acid ester, and titanic acid ester chelate are available. More specifically, stannous acetic acid, dibutyltin dilaurate, dibutyltin dioctate, dibutyltin diacetate, dioctyltin dilaurate, dioctyltin dioctate, dioctyltin diacetate, stannous dioctanoic acid, lead naphthenate, cobalt naphthenate, iron 2-ethylhexanoate, dioctyltin bis-octylthioglycolate ester, dioctyltin maleate ester, dibutyltin maleate polymer, dimethyltin mercaptopropionate polymer, dibutyltin bisacetylacetate, dioctyltin bis-acetyl laurate, tetrabutyltitanate, tetranonyltitanate, and bis(acetylacetonyl)dipropyl titanate could be used.

For the film forming liquid, anhydrous organochlorine solvent, hydrocarbon solvent, fluorocarbon solvent, silicone solvent, or a mixture of these was available as a solvent. If trying to increase the particle concentration by evaporating the solvent without cleaning, the boiling point of the solvent is preferably between 50 and 250 degrees Celsius. In addition, if the absorption agent is an alkoxysilane type and the organic coating is formed by evaporating the solvent, an alcohol solvent such as methanol, ethanol, propanol, or a mixture of these could be used in addition to the above listed solvents.

More precisely, chlorosilane nonaqueous petroleum naphtha, solvent naphtha, petroleum ether, petroleum benzine, isoparaffin, n-paraffin, decalin, industrial gasoline, nonan, decane, kerosine, dimethyl silicone, phenyl silicone, alkyl modified silicone, polyether silicone, and dimethylformamide can be used.

In addition, the fluorocarbon solvent can be a chlorofluorocarbon solvent, Fluorinert (a product manufactured by 3M Company), and Aflude (a product manufactured by Asahi Glass Co., Ltd.). These may be used solely, or two or more kinds may be mixed if the combination blends well. In addition, an organochlorine solvent such as chloroform may be added.

On the other hand, when a ketimine compound, organic acid, aldimine compound, enamine compound, oxazolidine compound, or an aminoalkylalkoxysilane compound was used instead of the silanol condensation catalyst, the processing time was reduced to about ½ to ⅔ at the same concentration.

Moreover, when the silanol condensation catalyst was mixed with a ketimine compound, organic acid, aldimine compound, enamine compound, oxazolidine compound, or aminoalkylalkoxysilane compound (although the ratio can vary from 1:9 to 9:1, it is normally preferable to be around 1:1), the processing time was even several times faster (to about half an hour) so that the time of film formation can be reduced to a fraction.

For example, when a dibutyltin oxide, which is a silanol catalyst, was replaced with H3 (from Japan Epoxy Resins Co., Ltd.), a ketimine compound, and the other conditions remained the same, we obtained almost the same results except that the reaction time was reduced to about one hour.

Moreover, when the silanol catalyst was replaced with a mixture of H3 (from Japan Epoxy Resins Co., Ltd.), a ketimine compound, and dibutyltin bis-acetylacetonate, a silanol catalyst (mixing ratio of 1:1), and the other conditions remained the same, we obtained almost the same result except that the reaction time was reduced to about half an hour.

Therefore, the above results clarified that the ketimine compound, organic acid, aldimine compound, enamine compound, oxazolidine compound, and aminoalkylalkoxysilane compound are more active than the silanol condensation catalyst.

Moreover, the activity was further enhanced when the silanol condensation catalyst was mixed with one selected from a ketimine compound, organic acid, aldimine compound, enamine compound, oxazolidine compound, and aminoalkylalkoxysilane compound.

The available ketimine compounds are not particularly limited, and include the following examples: 2,5,8-triaza-1,8-nonadien; 3,11-dimethyl-4,7,10-triaza-3,10-tridecadien; 2,10-dimethyl-3,6,9-triaza-2,9-undecadien; 2,4,12,14-tetramethyl-5,8,11-triaza-4,11-pentadecadien; 2,4,15,17-tetramethyl-5,8,11,14-tetraaza-4,14-octadecadien; 2,4,20,22-tetramethyl-5,12,19-triaza-4,19-trieicosadien; etc.

There are also no particular limitations to the organic acids available; however, for example, formic acid, acetic acid, propionic acid, butyric acid, and malonic acid showed almost the same effect.

Although the above Examples 1 to 4 described solar cells using fine silicon particles as examples, the present invention shall not be limited to silicon semiconductors. The present invention can be applied to any kind of semi-conductive fine particles, if the same chemical reaction can be applied to the semiconductor.

Furthermore, the use of the method of this invention shall not be limited to solar cells. It can be obviously applied to the production of light sensors.

The invention claimed is:

1. A solar cell comprising:
a transparent electrode covered by a first organic coating,
a film of n-type fine silicon particles, the film of n-type fine silicon particles including at least one n-type fine particle completely covered by and in direct contact with a second organic coating, and a film of p-type fine silicon particles, the film of p-type fine silicon particles including at least one p-type fine particle completely covered by and in direct contact with a third organic coating,
wherein the film of n-type fine silicon particles and the film of p-type fine silicon particles are laminated on the surface of a transparent substrate one after another,
the first organic coating and the second organic coating, and the second organic coating and the third organic coating are respectively bound to each other via respective covalent bonds,
at least one of the first organic coating, the second organic coating, or the third organic coating comprises a monomolecular film, and
each respective covalent bond is an N—C bond formed by a reaction of a respective epoxy group.

2. The solar cell as claimed in claim 1, wherein the first organic coating formed on the surface of the transparent substrate and the second organic coating formed on the surface of the n-type fine silicon particle, and the second organic coating formed on the surface of the n-type fine silicon particle and the third organic coating formed on the surface of the p-type fine silicon particle film are different from each other.

3. The solar cell as claimed in claim 1, wherein each respective covalent bond is formed between a respective epoxy group and a respective imino group.

4. The solar cell as claimed in claim 1, wherein the first, second, and third organic coatings each comprise a respective monomolecular film.

5. A method for manufacturing a solar cell comprising:
forming a first reactive organic coating on the surface of a transparent electrode by bringing the surface of the transparent electrode into contact with a chemical absorption liquid produced from a mixture of at least a first alkoxysilane compound, a first condensation catalyst, and a first nonaqueous organic solvent in order for the surface of the transparent electrode to react with the alkoxysilane compound;
forming a second reactive organic coating directly on and completely covering a surface of at least one n-type fine silicon particle by dispersing a plurality of n-type fine silicon particles among a chemical absorption liquid produced from a mixture of at least a second alkoxysilane compound, a second condensation catalyst, and a second nonaqueous organic solvent in order for the surface of the at least one n-type fine silicon particles to react with the alkoxysilane compound;

forming a third reactive organic coating directly on and completely covering a surface of at least one p-type fine silicon particle by dispersing a plurality of p-type fine silicon particles among a chemical absorption liquid produced from a mixture of at least a third alkoxysilane compound, a third condensation catalyst, and a third nonaqueous organic solvent in order for the surface of the p-type fine silicon particles to react with the alkoxysilane compound;

bringing the at least one n-type fine silicon particle into contact with the transparent electrode on the surface of the transparent substrate, on which the first reactive organic coating is formed, to undergo a first reaction;

removing excess n-type fine silicon particles coated by the second reactive organic coating to form a monostratal n-type fine silicon particle film;

bringing a surface of the monostratal n-type fine silicon particles film, on which the second reactive organic coating is formed, into contact with the at least one p-type fine silicon particle to undergo a second reaction;

removing excess p-type fine silicon particles coated by the third reactive organic coating to form a monostratal p-type fine silicon film; and forming a back surface electrode, wherein at least one of the first reactive organic coating, the second reactive organic coating, and the third reactive organic coating comprises a monomolecular film, and at least one of the first reaction or the second reaction comprises forming at least one covalent bond by reaction of an epoxy group.

6. The method for manufacturing a solar cell as claimed in claim 5, wherein first, second, and third reactive monomolecular films, which are covalently bound to the surfaces of the transparent electrode, the at least one n-type fine silicon particle, and the at least one p-type fine silicon particle, respectively, are formed by cleaning with an organic solvent after the respective reactions with the alkoxysilane compounds in the process of forming the first reactive organic coating, the process of forming the second reactive organic coating, and the process of forming the third reactive organic coating.

7. The method for manufacturing a solar cell as claimed in claim 5, wherein either the first reactive organic coating contains the epoxy group and the second reactive organic coating contains an imino group, or the first and third reactive organic coatings contain an imino group and the second reactive organic coating contains the epoxy group.

8. The method for manufacturing a solar cell as claimed in claim 6, wherein either the first reactive monomolecular film contains the epoxy group and the second reactive monomolecular film contains an imino group, or the first and third reactive monomolecular films contain an imino group and the second reactive monomolecular film contains the epoxy group.

9. The solar cell as claimed in claim 1, wherein two or more n-type fine silicon particle films and p-type fine silicon particle films are respectively stacked by forming covalent bonds between the second organic coating and the third organic coating.

10. The solar cell as claimed in claim 9, wherein the organic coatings formed on the surfaces of the n-type and p-type fine silicon particles respectively have two types, and the fine silicon particles with the second organic coating and the fine silicon particles with the third organic coating are alternately stacked.

11. The solar cell as claimed in claim 10, wherein the second organic coating is bonded to the third organic coating via covalent bonds formed by reactions between the second organic coating and the third organic coating.

12. The solar cell as claimed in claim 11, wherein at least one covalent bond is an N—C bond formed by a reaction between an epoxy group and an imino group.

13. The method for manufacturing a solar cell as claimed in claim 5, further comprising:

forming a fourth reactive organic coating on respective surfaces of additional n-type fine silicon particles;

forming a fifth reactive organic coating on respective surfaces of additional p-type fine silicon particles;

after forming the monostratal n-type fine silicon particle film, bringing the additional n-type fine silicon particles coated by the fourth reactive organic coating into contact with the surface of the monostratal n-type fine silicon particle film, on which the second reactive organic coating is formed, to undergo a third reaction;

removing a portion of the additional n-type fine silicon particles coated by the fourth reactive organic coating to form another monostratal n-type fine silicon particle film;

after forming the monostratal p-type fine silicon particle film, bringing the additional p-type fine silicon particles coated by the fifth reactive organic coating into contact with the surface of the monostratal p-type fine silicon particle film, on which the third reactive organic coating is formed, to undergo a fourth reaction; and removing a portion of the additional p-type fine silicon particles coated by the fifth reactive organic coating to form another monostratal p-type fine silicon particle film.

14. The method for manufacturing a solar cell as claimed in claim 13, wherein the fourth reactive organic coating comprises at least one first functional group that reacts with at least one second functional group of the second reactive organic coating.

15. The method for manufacturing a solar cell as claimed in claim 13, further comprising: after forming the first to fifth reactive organic coatings, cleaning the transparent electrode with an organic solvent to form a first reactive monomolecular film covalently bound with the transparent electrode.

16. The method for manufacturing a solar cell as claimed in claim 14, wherein the at least one first functional group comprises one of another epoxy group or an imino group.

17. The method for manufacturing a solar cell as claimed in claim 5, wherein at least one of the first condensation catalyst, the second condensation catalyst, or the third condensation catalyst comprises at least one of a silanol condensation catalyst, ketimine compound, organic acid, aldimine compound, enamine compound, oxazolidine compound, or an aminoalkylalkoxysilane compound.

18. The method for manufacturing a solar cell as claimed in claim 5, wherein at least one promoter, chosen from a ketimine compound, organic acid, aldimine compound, enamine compound, oxazolidine compound, or an aminoalkylalkoxysilane compound, is used by being mixed with at least one of the first condensation catalyst, the second condensation catalyst, or the third condensation catalyst.

19. A solar cell comprising:

a transparent substrate;

a transparent electrode disposed on the transparent substrate and covered by a first organic coating;

a film of n-type fine silicon particles disposed on the first organic coating, the film of n-type fine silicon particles including at least one n-type fine particle completely covered by and in direct contact with a second organic coating;

a film of p-type fine silicon particles disposed on the second organic covering, the film of p-type fine silicon particles including at least one p-type fine particle completely covered by and in direct contact with a third organic coating; and a back surface electrode disposed on the third organic coating, wherein at least one of the first organic coating, the second organic coating, or the third organic coating comprises a monomolecular film, each organic coating comprises at least one of an epoxy group or a primary amino group, and the first organic coating and the second organic coating, and the second organic coating and the third organic coating are respectively bound to each other via respective covalent bonds formed by respective reactions between the respective ones of the epoxy group and the primary amino group.

20. The solar cell as claimed in claim 19, wherein at least one of the n-type fine silicon particles or the p-type fine silicon particles comprises a monostratal film of silicon particles.

21. The solar cell as claimed in claim 20, wherein at least one of the n-type fine silicon particles or the p-type fine silicon particles comprises at least two monostratal films of silicon particles.

22. The solar cell as claimed in claim 19, wherein at least one of the n-type fine silicon particles or the p-type fine silicon particles comprises particles having a size of about 1 nm to about 100 nm.

23. The solar cell as claimed in claim 19, wherein at least one of the n-type fine silicon particles or the p-type fine silicon particles comprises semi-conductive fine silicon particles.

24. The solar cell as claimed in claim 19, wherein the first organic coating and the third organic coating each comprise a respective epoxy group and the second organic coating comprises a respective primary amino group.

25. The solar cell as claimed in claim 19, wherein the first organic coating and the third organic coating each comprise a respective amino group and the second organic coating comprises an epoxy group.

26. The solar cell as claimed in claim 19, wherein at least one of the first organic coating, the second organic coating, or the third organic coating have a breakdown voltage of about 0.1 V or less.

27. The solar cell as claimed in claim 19, wherein each of the first, second, and third organic coatings comprises a monomolecular film.

* * * * *

UNITED STATES PATENT AND TRADEMARK OFFICE
CERTIFICATE OF CORRECTION

| | |
|---|---|
| PATENT NO. | : 8,592,676 B2 |
| APPLICATION NO. | : 12/664242 |
| DATED | : November 26, 2013 |
| INVENTOR(S) | : Ogawa |

It is certified that error appears in the above-identified patent and that said Letters Patent is hereby corrected as shown below:

On the Title Page, in Item (56), under "OTHER PUBLICATIONS", in Column 2, Line 6, delete "e tal.," and insert -- et al., --, therefor.

In the Specification

In Column 1, Line 5, delete "APPLICATIONS" and insert -- APPLICATION --, therefor.

In Column 11, Line 41, delete "ITO transparent substrate 11," and insert -- ITO transparent electrode 11, --, therefor.

Signed and Sealed this
Eighth Day of April, 2014

Michelle K. Lee
*Deputy Director of the United States Patent and Trademark Office*